Jan. 19, 1960 C. P. GAZZARA ET AL 2,922,092

BASE CONTACT MEMBERS FOR SEMICONDUCTOR DEVICES

Filed May 9, 1957

WITNESSES:

Bernard R. Gieguez

Charles L. Board

INVENTORS
David L. Moore and
Charles P. Gazzara.
BY
Frederick Shapoe
ATTORNEY

United States Patent Office 2,922,092

Patented Jan. 19, 1960

2,922,092

BASE CONTACT MEMBERS FOR SEMICONDUCTOR DEVICES

Charles P. Gazzara, Fayetteville, N.Y., and David L. Moore, Hempfield Township, Westmoreland County, Pa., assignors to Westinghouse Electric Corporation, East Pittsburgh, Pa., a corporation of Pennsylvania Application May 9, 1957, Serial No. 658,200

4 Claims. (Cl. 317—234)

Figure 1:
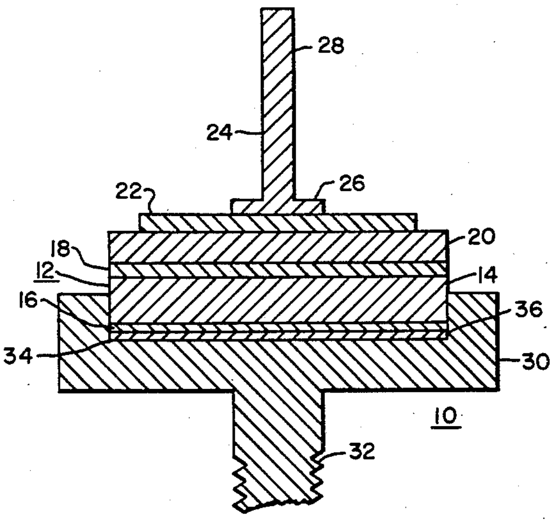

This invention relates to base contact members and to semiconductor devices embodying same.

More particularly, the invention relates to base contact members adapted to be soldered to base mounts, said base contact being composed of a body of a metal having a coefficient of thermal expansion of substantially the same value as that of silicon, said body having applied thereto a thin coating of a metal that is throughly and uniformly wetted by solders and is resistant to chemical etchants.

In the preparation of P–N junction semiconductor devices from silicon, the silicon material must be employed in the form of an extremely thin wafer whose thickness is of the order about 5 mils to 15 mils. Silicon wafers are quite brittle and fragile so that they will break or shatter if subjected to any appreciable mechanical stresses. Breakage may be encountered not only during the manufacture and assembly of rectifiers embodying a silicon wafer, but also during use by reason of differential thermal expansion that takes place between the wafer of silicon and a base contact to which it is affixed, as the rectifier device embodying them heats up in use.

Another problem encountered in preparing satisfactory rectifiers from silicon semiconductor materials is to dissipate rapidly and efficiently the heat developed during use. Excessive temperatures, above about 220° C., may impair operation of the rectifier if it is subjected to heavy electrical loads while at such elevated temperatures. The silicon wafer must, therefore, be mounted on a metal having good thermal conductivity.

It is also necessary that the material employed as the base contact member be thoroughly and uniformly wetted by soft solder materials to assure good thermal and electrical contact between the base contact member and a base mount to which it is affixed.

After assembly of silicon diodes, it is customary to treat the assembly with chemical etchants. The chemical etchants, usually composed of strong acids such as nitric acid and hydrofluoric acid, are employed to clean the silicon diode around the surface of the junction of the silicon wafer and the counter electrode or upper contact member thereby improving the electrical characteristics of the diode. It is desirable that the base contact member be composed of a material that will not be dissolved by the chemical etchant or will not impair the efficient operation of the silicon diode, should small amounts of the material be dissolved by the etchant.

The object of this invention is to provide a base contact member for use in a semiconductor device, the base contact member being adapted to be soldered to a base mount, the base contact member comprising a body of a metal selected from the group consisting of tantalum, tungsten and base alloys thereof having a coefficient of thermal expansion approaching that of silicon, said body having applied thereto a thin coating of a metal selected from the group consisting of gold, platinum and rhodium.

Another object of this invention is to provide a semiconducting member comprising a silicon wafer bonded to a base contact member by means of a solder material, said base contact member being soldered to a base mount and comprising a body of a metal selected from the group consisting of tantalum, tungsten and these alloys thereof having a coefficient of thermal expansion approaching that of silicon and having a relatively thin bonded coating of a metal selected from the group consisting of gold, platinum and rhodium.

Other objects of the invention will, in part, be obvious and will, in part, appear hereinafter.

Figure 2:
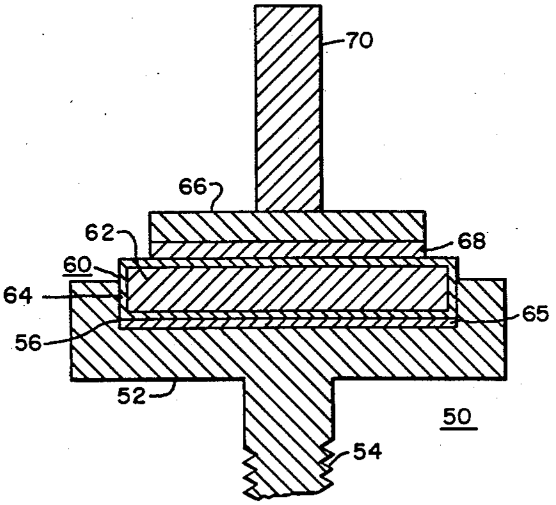

For a better understanding of the nature and objects of the invention attention is directed to the accompanying drawing, in which:

Figure 1 is a cross-section through one semiconductor device constructed in accordance with this invention; and Fig. 2 is a cross-section through a modified form of the invention.

The metals tantalum and tungsten have a coefficient of linear thermal expansion of substantially the same value as that of silicon, about $4.2 \times 10^{-6}$ inch per inch per degree centigrade. Alloys of tantalum and tungsten, for example an alloy composed of 5% tungsten and 95% tantalum, also have nearly the same coefficient of thermal expansion as silicon. Tantalum and tungsten can be alloyed with minor amounts of other metals without greatly changing their coefficient of thermal expansion. Thus, tungsten may be alloyed with 5% to 25% by weight of a platinum metal, for example osmium or platinum, chromium, nickel, cobalt, silicon, and silver. A coefficient of thermal expansion of between about $3.8 \times 10^{-6}$ and $6.5 \times 10^{-6}$ inch per inch per degree centigrade is satisfactory for cooperation with a silicon wafer.

The metals tantalum, tungsten and base alloys thereof that possess a coefficient of thermal expansion approaching that of silicon, have good thermal conductivity so that they will carry away heat rapidly from silicon disposed in contact therewith.

After the preparation of a silicon diode assembly, the assembly is hermetically enclosed in order to protect the silicon and other portions of the assembly from the atmosphere. In the process of enclosing the diode, it is customary first to secure the base contact member to a base mount which may be in the form of a recessed metal cup. This is usually accomplished by soldering techniques, a low melting point solder being applied in order to bond the base contact member of the diode assembly to the base mount. It has been determined that the temperature required in this operation should not exceed approximately 400° C. Temperatures above about 400° C. may adversely affect the characteristics of the diode assembly. Owing to this temperature limitation, soft solders having melting points below 400° C. and preferably about 300° C., must be employed. It has been found that the soft solders do not form a good mechanical bond having high thermal conductivity with the metals tungsten, tantalum and base alloys thereof. As a result, the satisfactory operation of the completed assembly may be impaired.

For convenience, the metal tungsten will be specifically referred to hereinafter, but it will be understood that tantalum or any alloy of tantalum or tungsten that has a coefficient of thermal expansion approaching that of silicon can be substituted therefor.

In accordance with this invention, it has been found that a good mechanical bond can be produced between a body of tungsten and other metals by use of soft solders if the tungsten body is first coated with a thin coating of a metal selected from the group consisting of gold, platinum and rhodium. In addition, such coated metals possess excellent resistance to chemical etchants.

The meal coating can be applied to the tungsten body in any convenient manner such as electroplating, spraying or cladding. The coating may be applied in any desired thickness, thicknesses of the order of about 0.2 mil for gold and platinum coatings, and 0.02 mil for rhodium coatings have been found adequate. The thickness of the coating may be varied to as much as one mil or it may be as low as 0.01 mil. The tungsten body is cleaned by abrading, etching and washing though abrading with a sand blast alone is satisfactory, to remove all surface contamination therefrom prior to the application of the coating metal.

Referring to Figure 1 of the drawing, there is shown a semiconductor diode assembly which is suitable for screwing into panels and other devices. The diode 10 comprises a base contact member 12 prepared in accordance with this invention. The base contact member comprises a body 14 of a metal selected from the group consisting of tantalum, tungsten and base alloys thereof that have a coefficient of thermal expansion approaching that of silicon and a thin coating or layer 16 of a metal selected from the group consisting of gold, platinum and rhodium. A layer of silver base solder 18 is applied to the upper surface of base contact member 12 to provide for maintaining a fused metallurgical bond therewith and with a silicon wafer 20 disposed on the base contact member 12. To the upper surface of the silicon wafer 20 is fused a layer 22 of an aluminum metal selected from the group consisting of aluminum and aluminum base alloys. A nail shaped counter electrode 24 of tantalum comprising a flat face 26 as the horizontal leg is fused to the upper surface of the layer 22 of aluminum metal. The vertical leg 28 of the tantalum counter electrode 24 is relatively flexible and provides for carrying electrical current to the diode. The base contact member 12 is secured to a screw base 30 having a threaded extension 32. In the upper face of the screw 30 is provided a recess 34 within which is disposed the base contact member 12 which is attached by a lawer 36 of soft solder to the screw base 30.

The thin layer 18 of silver base solder which fusibly joins the silicon wafer 20 to the base contact member 12 may be a high or low melting point alloy of silver. Suitable silver base solders are composed of silver and either an element of group IV of the periodic table, or an N-type doping impurity, or both.

The alloys are composed of at least 5% silver, the balance not exceeding 90% by weight of tin, not exceeding 20% by weight of germanium and not exceeding 95% by weight of lead, and a small proportion of antimony or other N-type doping impurity. Particularly good results have been obtained with the following binary alloys in which all parts are by weight: binary alloys comprising 35% to 10% of silver and from 65% to 90% of tin; 95% to 84% of silver and from 5% to 16% of silicon; 75% to 50% of silver and from 25% to 50% of lead; and 95% to 70% of silver and from 5% to 30% of germanium. Ternary aloys of silver, tin and silicon; silver, lead and silicon; and silver, germanium and silicon are particularly advantageous. For example, the ternary alloys may comprise 50% to 80% silver and 5% to 16% silicon, the balance being tin, lead or germanium. The silver alloy may include small amounts of other elements and impurities, providing, however, that no significant amount of a group III element is present. The silver base solder may include up to 10% by weight of antimony. Thus, good results may be obtained using solders containing (1) 98% silver, 1% lead and 1% antimony; (2) 80% silver, 16% lead and 4% antimony; and (3) 85% silver, 5% silicon, 8% lead and 2% antimony.

When these silver alloy solders are applied to the silicon wafer, some of the silicon from the wafer dissolves in the alloy and, consequently, binary and ternary alloys which are applied without silicon being present therein will, after fusion, contain a small but substantial amount of silicon. Thus, an alloy comprising 84% silver 1% antimony, 10% tin and 5% germanium applied to a silicon wafer will, after fusion, contain from 5% to 16% by weight of silicon, depending upon the length of time and the temperatures to which the solder alloy and the silicon are subjected.

Excellent results have been obtained with alloys comprising from 1% to 4% by weight of lead, from 1% to 4% antimony, and the balance, 98% to 95% being silver. Thin sheets of these ternary silver alloys have been applied to the silicon wafers and after heating the assembly to brazing temperatures, the silver alloy melts and dissolves some of the silicon, and a portion of the silicon diffuses therein so that the fused bonding layer may comprise from 5% to 16% by weight of silicon, about 1% to 4% by weight each of lead and antimony, and the balance being silver. The lead-antimony-silver alloy is ductile and may be readily rolled into thin films of a thickness of from 1 to 2 mils. The thin films may be then cut or punched into small pieces of approximately the same area as the silicon wafters and applied thereto.

The silver base alloy may be prepared in powder or granular form and a thin layer thereof applied to the end contact either dry or in the form of a paste in a volatile solvent, such as ethyl alcohol.

The thin layer 22 of aluminum metal that has been placed on the upper surface of the silicon wafer 20 may comprise a film or foil of aluminum or of an aluminum base alloy and preferably, an aluminum base alloy with an element of either group III or group IV, or both, of the periodic table. The aluminum member must comprise a material which, when fused to the silicon wafer 20, will dissolve some of the underlying silicon, and when cooled, will redeposit silicon having P-type conductvity on the upper portions of the wafer 20.

The layer 22 may comprise pure aluminum with only slight amounts of impurities being present, such as magnesium, zinc and the like; or an alloy composed of aluminum as a major component, the balance being silicon, gallium, indium and germanium, individually, or any two or all of the latter being present. These alloys should not melt below about 300° C. Thus, a foil of 95% aluminum and 5% silicon; 88.4% aluminum and 11.6% silicon; 90% aluminum and 10% germanium; 47% aluminum and 53% germanium; 88% aluminum and 12% indium; 96% aluminum and 4% by weight of indium; 50% aluminum, 20% silicon, 20% indium and 10% germanium; 90% aluminum, 5% silicon, and 5% indium; 85% aluminum, 5% silicon, 5% indium and 5% germanium; and 88% aluminum, 5% silicon, 2% indium and 3% germanium may be employed (all parts being by weight). It is critical that the aluminum layer 22 be substantially smaller than the area of the silicon wafer 20 and that it be centered on the wafer 20 with a substantial clearance from the corners or edge of the wafer. It is not necessary that the aluminum layer 22 be a foil or a separate layer. It has been found that it is possible to vapor-coat the aluminum or the aluminum base alloy on the silicon wafer in a vacuum. The selected central portions of the upper surface of the silicon wafer may be vapor-coated with aluminum or aluminum base alloy, by masking the edges of the wafer, or the upper contact itself may be vapor-coated with the aluminum metal.

In preparing the diode of Fig. 1, the assembly comprising the base contact 12, the silver solder 18, the silicon wafer 20, the aluminum member 22 and the upper tantalum contact member 24 is heated while being maintained together under light pressure to a temperature of approximately 800° C. to 1000° C. while under vacuum. In a short period of time, the silver solder 18 will have fused and joined the base 12 to the silicon wafer 20. Likewise, the aluminum layer 22 will have fused, and on cooling, it will have bonded to the tantalum contact 24 and a metallurgical bond is effected to the upper surface of the silicon wafer 20. During the heating, aluminum will dissolve the adjacent silicon on the upper surface of the silicon wafer, and on cooling, dissolved silicon with P-type conductivity is redeposited, thereby converting the adjacent surface portions into silicon with P-type semiconductivity whereby a P–N junction is present. When the fused assembly is cooled to room temperature, it is etched. After etching, the fused assembly is then placed within the recess 34 of the screw base 30 with a low melting point solder 36 which melts below 300° C., for example, being applied in order to fusibly bond the diode assembly to the member 30. Temperature during this last operation should not exceed approximately 400° C. The diode 10 of Fig. 1 of the drawing may be then encapsulated or placed in a hermetical metal case in order to protect the silicon and other portions of the assembly from the atmosphere.

A good mechanical bond is formed between base contact member 12 and screw base 30. The thin layer 16 of gold, platinum, or rhodium provides a surface on the base contact member 12 that is thoroughly and uniformly wetted by soft solders.

Referring to Fig. 2 of the drawing, there is illustrated a modified form of semiconductor diode 50. The diode 50 comprises a screw base 52 having a threaded extension 54. In the upper face of the screw base 52 is provided a recess 56 within which is disposed a base contact member 60. The base contact member 60 comprises a body 62 of tantalum, tungsten or base alloys thereof having a coefficient of thermal expansion of substantially the same value as that of silicon completely enclosed in a thin layer 64 of a metal selected from the group consisting of gold, platinum and rhodium. The base contact member 60 is securely bonded to the screw base 52 by means of a low melting point solder 65.

There is applied to the upper surface of the base contact member 60 a wafer 66 of silicon previously cut to suitable size or shape. The silicon wafer has been lapped and etched to produce a wafer having desired semiconductor characteristics. The wafer will be doped with an N-type doping impurity in order to impart thereto N-type semiconductivity. A thin layer of silver base solder 68 fusibly joins the silicon wafer 66 to the base contact member 60. A rod-like counter electrode 70 of an aluminum metal selected from the group consisting of aluminum and aluminum base alloys is welded to the silicon diode. The counter electrode 70 may comprise the same composition as the layer 22 of Fig. 1.

The semiconductor diode 50 is prepared in a manner similar to the preparation of the semiconductor diode 10 of Fig. 1. The aluminum counter electrode 70 is welded into position on the wafer 66 by passing electric current through the assembly. Current carrying leads may be attached mechanically or by brazing to the upper end of counter electrode 70.

The semiconductor diode of Fig. 2 is subjected to a thorough etching treatment prior to securing the base contact member 60 thereof to screw base member 52. The etching treatment cleans the junction between the aluminum counter electrode 70 and the wafer 66 of silicon in order to prevent any inefficient operation of the resulting diode assembly.

A base contact member comprising tungsten is adversely affected by the strong chemical etchants normally employed. Therefore, it is desirable to completely enclose the tungsten body in an imperforate coating of gold, platinum or rhodium. If only the surface of the tungsten body that makes contact with the screw base member is coated, then it is important that none of the etchant material come in contact with the exposed surface tungsten body. By applying the coating to the entire tungsten body, the etchant can be applied in any convenient manner without causing any undesirable result.

Tantalum is not adversely affected by the etchants normally employed. Therefore, base contact members comprising tantalum need be coated only on that one surface to which the screw base is fusibly bonded.

Suitable etching agents comprise a mixture of equal parts by volume of nitric acid and hydrofluoric acid. The hydrofluoric acid may comprise 48% to 50% HF and the nitric acid may be of 25% concentration. Other suitable etchants for silicon are well known in the art.

It will be understood that the above description and drawing are illustrative and not limiting.

We claim as our invention:

1. In a semiconductor device, a base contact member adapted to be soldered to a base mount and having a wafer of silicon bonded to a surface other than the surface to be soldered to the base mount, the base contact member comprising a body of a metal selected from the group consisting of tungsten, tantalum and base alloys thereof having a coefficient of thermal expansion approaching that of silicon, and a relatively thin bonded coating of a thickness of the order of from 1 mil to 0.01 mil of a metal selected from the group consisting of gold, platinum and rhodium applied to at least that surface of said base contact member to be applied to the base mount, said coating being applied to the base contact member in order to enable satisfactory soldering to be effected thereto.

2. In a semiconductor device, in combination, a base contact member adapted to be soldered to a base mount, said base contact member comprising a body of a metal selected from the group consisting of tungsten, tantalum and base alloys thereof having a coefficient of thermal expansion approaching that of silicon, a wafer of silicon having one surface conforming to a surface of the base contact member, the two surfaces being in juxtaposition, and a solder comprising silver disposed between and bonding the silicon wafer to the base contact member, the base contact member having a relatively thin bonded coating of a thickness of the order of from 1 mil to 0.01 mil of a metal selected from the group consisting of gold, platinum and rhodium applied to at least that surface of said base contact member to be applied to the base mount, said coating being applied to the base contact member in order to enable satisfactory soldering to be effected thereto.

3. In a semiconductor device, in combination, a base contact member adapted to be soldered to a base mount, said base contact member comprising a body of a metal selected from the group consisting of tungsten, tantalum and base alloys thereof having a coefficient of thermal expansion approaching that of silicon, a wafer of silicon having one surface conforming to a surface of the base contact member, the two surfaces being in juxtaposition, and a solder disposed between and bonding the silicon wafer to the base contact member, the solder comprising a silver alloy composed of from 0.5% to 8% by weight of antimony, at least 72% by weight of silver and the balance comprising at least one element from the group consisting of germanium, silicon, lead and tin, the base contact member having a relatively thin bonded coating of a thickness of the order of from 1 mil to 0.01 mil of a metal selected from the group consisting of gold, platinum and rhodium applied to at least that surface of said base contact member to be applied to the base mount, said coating being applied to the base contact member in order to enable satisfactory soldering to be effected thereto.

4. In a semiconductor rectifier, in combination, a base contact member adapted to be soldered to a base mount comprising a body of a metal selected from the group consisting of tungsten, tantalum and base alloys thereof having a coefficient of thermal expansion approaching that of silicon, a wafer of silicon having one surface conforming to a surface of the base contact member, the two surfaces being in juxtaposition and a solder disposed between and bonding the silicon wafer to the base contact member, the solder comprising a silver alloy composed of from 0.5% to 8% by weight of antimony, at least 72% by weight of silver and the balance comprising at least one element selected from the group consisting of germanium, silicon, lead and tin, and a second contact member bonded to another surface of the silicon wafer, the base contact member having a relatively thin bonded coating of a thickness of the order of from 1 mil to 0.01 mil of a metal selected from the group consisting of gold, platinum and rhodium applied to at least that surface of said base contact member to be applied to the base mount, said coating being applied to the base contact member in order to enable satisfactory soldering to be effected thereto.

References Cited in the file of this patent

UNITED STATES PATENTS

| | | |
|---|---|---|
| 2,402,661 | Ohl | June 25, 1946 |
| 2,662,997 | Christensen | Dec. 15, 1953 |
| 2,763,822 | Frola et al. | Sept. 18, 1956 |
| 2,790,940 | Prince | Apr. 30, 1957 |
| 2,796,563 | Ebers et al. | June 18, 1957 |